(12) United States Patent
Chen et al.

(10) Patent No.: US 10,251,482 B2
(45) Date of Patent: Apr. 9, 2019

(54) BRACKET DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/447,087

(22) Filed: Mar. 1, 2017

(65) Prior Publication Data
US 2018/0084908 A1 Mar. 29, 2018

(30) Foreign Application Priority Data
Sep. 24, 2016 (TW) .............................. 105131171 A

(51) Int. Cl.
| A47B 96/07 | (2006.01) |
| H05K 7/18 | (2006.01) |
| A47B 88/43 | (2017.01) |
| H05K 7/14 | (2006.01) |
| A47B 57/48 | (2006.01) |
| A47B 57/54 | (2006.01) |
| A47B 47/00 | (2006.01) |
| A47B 46/00 | (2006.01) |
| A47B 57/40 | (2006.01) |

(52) U.S. Cl.
CPC ............ *A47B 96/07* (2013.01); *A47B 57/487* (2013.01); *A47B 57/545* (2013.01); *A47B 88/43* (2017.01); *H05K 7/1489* (2013.01); *H05K 7/183* (2013.01); *A47B 46/00* (2013.01); *A47B 47/0058* (2013.01); *A47B 57/408* (2013.01); *H05K 7/1421* (2013.01)

(58) Field of Classification Search
CPC .... H05K 7/1489; H05K 7/1421; H05K 7/183; A47B 88/43; A47B 88/40; A47B 2088/4235; A47B 46/00; A47B 47/0058
USPC ............ 248/220.22, 220.41, 221.11, 222.11, 248/224.8, 218.4, 235, 243, 245, 246; 211/26, 153, 175, 192; 312/223.1, 330.1, 312/333, 334.4, 334.44, 334.5
See application file for complete search history.

(56) References Cited

U.S. PATENT DOCUMENTS

| 5,791,498 A * | 8/1998 | Mills ...................... H02B 1/34 211/183 |
| 6,659,577 B2 * | 12/2003 | Lauchner .............. H05K 7/1421 312/223.1 |
| 6,926,378 B2 * | 8/2005 | Greenwald .......... H05K 7/1421 312/223.1 |

(Continued)

*Primary Examiner* — Jonathan Liu
*Assistant Examiner* — Taylor L Morris
(74) *Attorney, Agent, or Firm* — Winston Hsu

(57) ABSTRACT

A bracket device includes a side wall, an end wall and a supporting base. The end wall is bent relative to the side wall. The end wall has a first hole and a second hole. The supporting base has a first base hole and a second base hole. The first base hole and the second base hole are arranged at positions respectively corresponding to the first hole and the second hole of the end wall. Each of the first base hole and the second base hole has a thread feature.

10 Claims, 7 Drawing Sheets

(56) References Cited

U.S. PATENT DOCUMENTS

| | | | |
|---|---|---|---|
| 7,255,409 B2 * | 8/2007 | Hu | A47B 88/43 211/26 |
| 7,357,362 B2 | 4/2008 | Yang | |
| 7,552,899 B2 * | 6/2009 | Chen | A47B 88/43 211/26 |
| 7,699,279 B2 * | 4/2010 | Chen | A47B 88/43 248/220.22 |
| 7,703,734 B2 * | 4/2010 | Chen | A47B 88/43 108/108 |
| 7,780,253 B1 * | 8/2010 | Lu | H05K 7/183 211/26 |
| 8,028,965 B2 * | 10/2011 | Chen | H05K 7/1489 248/298.1 |
| 8,033,621 B2 * | 10/2011 | Liang | H05K 7/1489 312/334.4 |
| 8,146,756 B2 * | 4/2012 | Brock | A47B 96/06 211/192 |
| 8,322,668 B2 | 12/2012 | Tang | |
| 8,328,300 B2 * | 12/2012 | Yu | A47B 88/43 312/333 |
| 8,371,454 B2 * | 2/2013 | Chen | H05K 7/1421 211/26 |
| 8,403,434 B2 * | 3/2013 | Yu | H05K 7/1489 248/244 |
| 8,562,086 B1 * | 10/2013 | Baik | H05K 7/1489 312/223.1 |
| 8,596,471 B2 * | 12/2013 | Chen | H05K 7/1421 211/153 |
| 8,596,731 B2 * | 12/2013 | Chen | H05K 7/1421 312/330.1 |
| 8,602,225 B2 * | 12/2013 | Lin | A47B 88/43 211/26 |
| 8,807,351 B2 * | 8/2014 | Lin | A47B 88/43 211/26 |
| 8,967,565 B2 * | 3/2015 | Chen | A47B 88/044 211/192 |
| 9,237,808 B2 | 1/2016 | Chen | |
| 9,681,573 B2 * | 6/2017 | Chen | H05K 7/1489 |
| 9,717,333 B2 * | 8/2017 | Chen | A47B 88/43 |
| 9,854,911 B1 * | 1/2018 | Chang | A47B 96/068 |
| 9,961,995 B2 * | 5/2018 | Kam | A47B 57/485 |
| 2004/0016712 A1 * | 1/2004 | Hamilton | A47B 88/43 211/134 |
| 2011/0290746 A1 * | 12/2011 | Lu | H05K 7/1489 211/26 |
| 2013/0026113 A1 * | 1/2013 | Fan | H05K 7/1489 211/26 |
| 2013/0032678 A1 * | 2/2013 | Chen | H05K 7/1421 248/224.8 |
| 2014/0070064 A1 * | 3/2014 | Chen | A47B 88/044 248/221.11 |
| 2014/0265788 A1 * | 9/2014 | Judge | H05K 7/1489 312/334.1 |
| 2015/0069196 A1 * | 3/2015 | Chen | A47B 47/0058 248/218.4 |
| 2015/0201754 A1 * | 7/2015 | Chen | A47B 96/025 248/219.3 |
| 2015/0335156 A1 * | 11/2015 | Chen | A47B 96/07 248/219.1 |
| 2017/0290424 A1 * | 10/2017 | Chen | A47B 88/43 |
| 2017/0354055 A1 * | 12/2017 | Hsu | H05K 7/1489 |
| 2018/0271275 A1 * | 9/2018 | Chen | A47B 88/43 |

\* cited by examiner

BRACKET DEVICE

BACKGROUND OF THE INVENTION

1. Field of the Invention

The present invention relates to a bracket device, and more particularly, to a bracket device applicable to a slide rail.

2. Description of the Prior Art

Generally, in a rack system, a carried object can be mounted to a rack through a pair of slide rail assemblies. Wherein, a first rail of the slide rail assembly is usually mounted to a post of the rack through a bracket device, and a second rail of the slide rail assembly is movable relative to the first rail, and configured to carry the carried object.

U.S. Pat. No. 8,322,668 B2 discloses a mounting apparatus for slide rail. The mounting apparatus comprises a mounting bracket (20) configured to be mounted to a post (10). Wherein, two fasteners (40) is configured to pass through positioning holes (12) of the post (10) and through holes (231) of an end plate (23) of the mounting bracket (20), in order to be further fastened to two corresponding fixing holes (31) on a fixing plate (30).

However, for consideration of structural configuration or market requirements, it is important to develop different products for improving structural strength.

SUMMARY OF THE INVENTION

The present invention provides a bracket device having a supporting base for improving structural strength.

According to an embodiment of the present invention, a bracket device comprises a side wall, an end wall, a first mounting member and a supporting base. The end wall is substantially perpendicularly connected to the side wall, and the end wall has a first hole and a second hole. The first mounting member has a first portion passing through the first hole of the end wall, and the first portion of the first mounting member has a first thread feature. The supporting base has a first base hole and a second base hole. Each of the first base hole and the second base hole has a second thread feature. Wherein, the first thread feature of the first mounting member is configured to be screwed into the second thread feature of the first base hole of the supporting base; the second base hole of the supporting base is arranged at a position corresponding to the second hole of the end wall; and the end wall has a first thickness and the supporting base has a second thickness greater than the first thickness.

Preferably, the bracket device further comprises a second mounting member. The second mounting member has a second portion passing through the second hole of the end wall, and the second portion of the second mounting member has the first thread feature configured to be screwed into the second thread feature of the second base hole of the supporting base.

Preferably, the end wall further has a third hole, and the supporting base further has a third base hole having the second thread feature. The third base hole is arranged at a position corresponding to the third hole.

Preferably, the supporting base is located at a first side of the end wall. The bracket device further comprises an elastic member and a fastening member. The elastic member is configured to provide an elastic force to the fastening member. The fastening member has a fastening part configured to be held at a second side of the end wall in response to the elastic force of the elastic member.

Preferably, the side wall comprises a blocking part. The elastic member is arranged on the side wall, and the elastic member comprises an elastic part located between the blocking part and the fastening member.

Preferably, the end wall is perpendicularly extended from the side wall.

According to another embodiment of the present invention, a bracket device comprises a side wall, an end wall, an elastic member and a fastening member. The end wall is bent relative to the side wall, and the end wall has a first hole and a second hole. Wherein, the elastic member is located at a first side of the end wall and configured to provide an elastic force to the fastening member, and the fastening member has a fastening part configured to be held at a second side of the end wall in response to the elastic force of the elastic member.

Preferably, the bracket device further comprises a supporting base. The supporting base has a first base hole and a second base hole, and the first base hole and the second base hole are arranged at positions respectively corresponding to the first hole and the second hole of the end wall. Each of the first base hole and the second base hole has a thread feature, and the supporting base is located at the first side of the end wall.

Preferably, the end wall is substantially perpendicularly connected to the side wall, the bracket device further comprises a first mounting member and a second mounting member respectively passing through the first hole and the second hole of the end wall to be screwed into the thread features of the first base hole and the second base hole of the supporting base.

Preferably, the fastening member is pivoted to the side wall.

Preferably, the side wall has an opening and a blocking part. The elastic member is arranged on the side wall, and the elastic member comprises an elastic part located between the blocking part and the fastening member. The fastening member partially passes through the opening to abut against the elastic part of the elastic member.

According to another embodiment of the present invention, a bracket device is configured to mount a slide rail to a rack, and the rack comprises a post with a first post hole and a second post hole. The bracket device comprises a side wall, an end wall, a first mounting member and a supporting base. The side wall is mounted to the slide rail. The end wall is substantially perpendicularly connected to the side wall, and the end wall has a first hole and a second hole. The first mounting member is configured to pass through the first post hole of the post of the rack. The first mounting member has a first portion passing through the first hole of the end wall, and the first portion of the first mounting member has a first thread feature. The supporting base has a first base hole and a second base hole, and each of the first base hole and the second base hole has a second thread feature. Wherein, the first thread feature of the first mounting member is configured to be screwed into the second thread feature of the first base hole of the supporting base; the second base hole of the supporting base is arranged at a position corresponding to the second hole of the end wall; and the supporting base is located at a first side of the end wall, the bracket device further comprises an elastic member and a fastening member, the elastic member is configured to provide an elastic force to the fastening member, the fastening member has a fastening part configured to be held at a second side of the end wall in response to the elastic force of the elastic member, in order to lock the post of the rack.

Preferably, the bracket device further comprises a second mounting member configured to pass through the second post hole of the post of the rack, wherein the second mounting member has a second portion passing through the second hole of the end wall, and the second portion of the second mounting member has the first thread feature configured to be screwed into the second thread feature of the second base hole of the supporting base.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
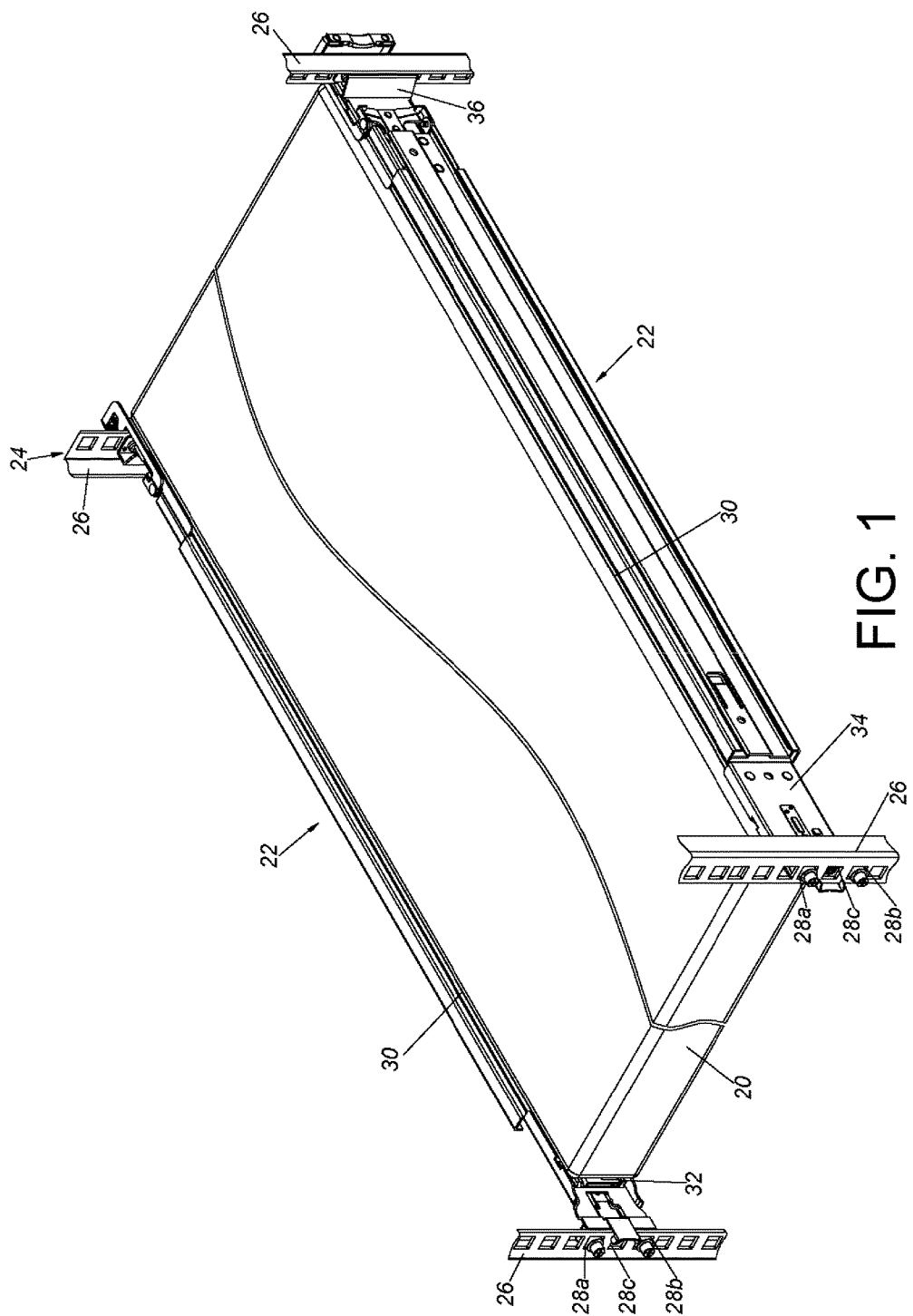
FIG. 1 is a diagram showing a rack system according to an embodiment of the present invention.

FIG. 1 is a diagram showing a carried object 20 being mounted to a rack 22 through a pair of slide rail assemblies 22 in a rack system. In the present embodiment, the carried object 20 can be an electronic apparatus, and the rack 24 comprises two pairs of posts 26. The posts 26 correspond to each other and are spaced from each other. Each of the posts 26 has a plurality of post holes, such as a first post hole 28a, a second post hole 28b and a third post hole 28c. In particular, each of the slide rail assemblies 22 comprises a first rail 30 and a second rail 32 movable relative to the first rail 30. The first rail 30 is mounted to one pair of the posts 26 of the rack 24 through a first bracket device 34 and a second bracket device 36. On the other hand, the second rail 32 is configured to carry the carried object 20.

Figure 2:
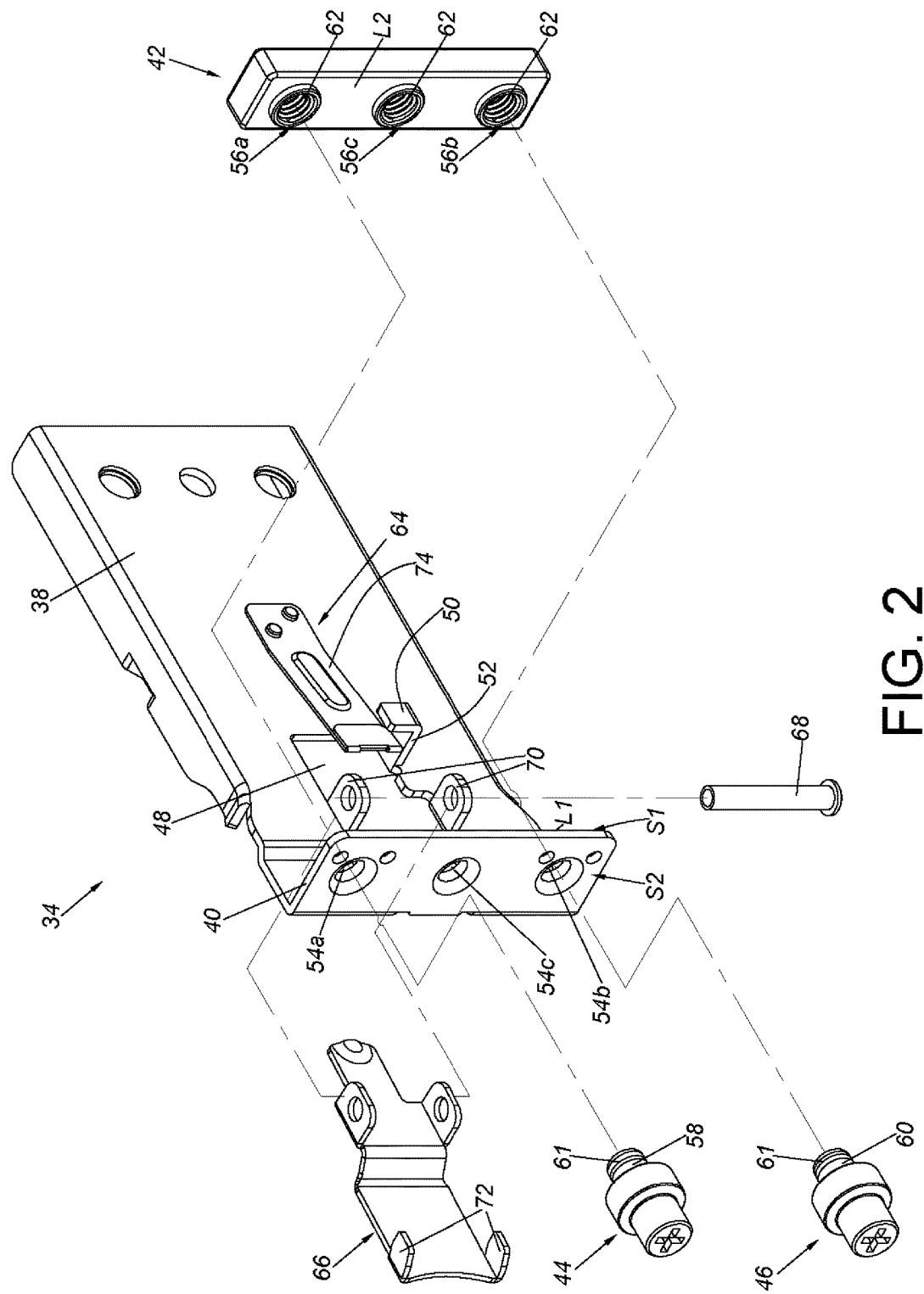
FIG. 2 is an exploded view of a bracket device according to an embodiment of the present invention.
Figure 3:
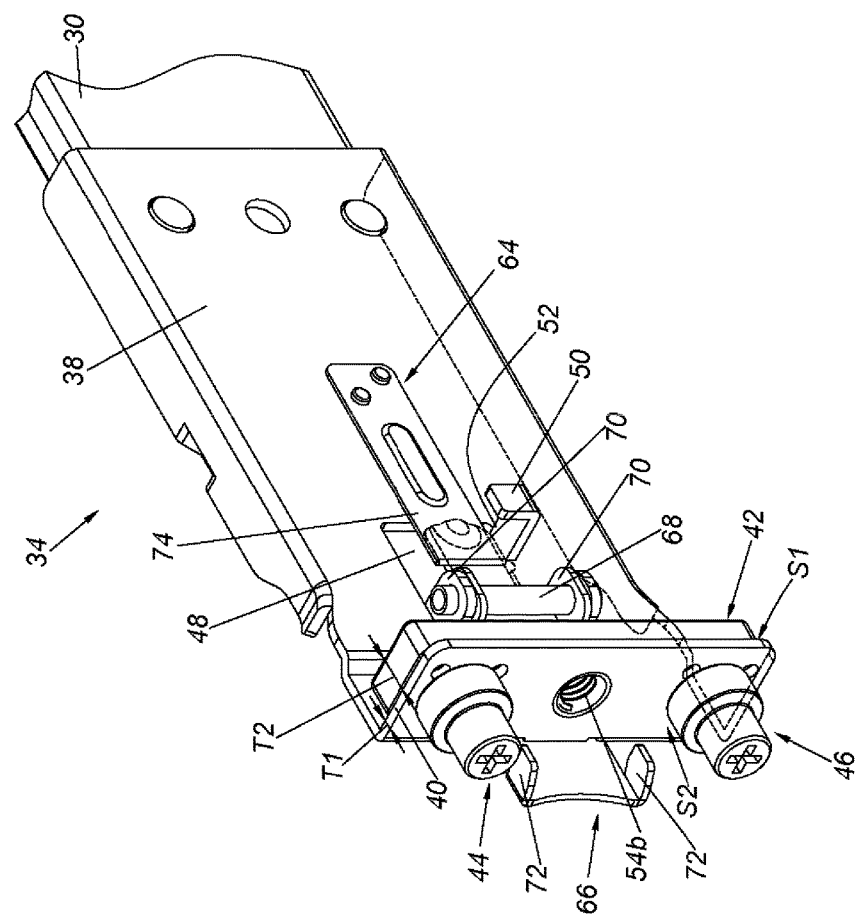
FIG. 3 is a diagram showing the bracket device connected to a slide rail according to an embodiment of the present invention.

As shown in FIG. 2 and FIG. 3, the first bracket device 34 (also referred to as bracket device) comprises a side wall 38, an end wall 40 and a supporting base 42. Preferably, the bracket device 34 further comprises a first mounting member 44 and a second mounting member 46.

The side wall 38 is mounted to the first rail 30 (also referred to as slide rail). For example, the side wall 38 can be connected to the first rail 30 by riveting, screwing or welding. Furthermore, the side wall 38 is substantially longitudinally arranged. Preferably, the side wall 38 has an opening 48 and a blocking part 50. In the present embodiment, the side wall 38 further comprises an extension part 52 substantially transversely extended from the side wall 38. On the other hand, the blocking part 50 is bent relative to the extension part 52.

The end wall 40 is bent relative to the side wall 38. The end wall 40 has a first hole 54a and a second hole 54b. Preferably, the end wall 40 further has a third hole 54c. Furthermore, the end wall 40 is substantially perpendicularly connected to the side wall 38. In the present embodiment, the end wall 40 is perpendicularly extended from the side wall 38. The end wall 40 has a first thickness T1. The end wall 40 has a first side S1 and a second side S2 opposite to the first side S1.

The supporting base 42 has a first base hole 56a and a second base hole 56b. Preferably, the supporting base 42 further has a third base hole 56c. Wherein, the first base hole 56a, the second base hole 56b and the third base hole 56c are arranged at positions respectively corresponding to the first hole 54a, the second hole 54b and the third hole 54c of the end wall 40. Preferably, the supporting base 42 is located at the first side S1 of the end wall 40 and the supporting base 42 has a second thickness T2 greater than the first thickness T1 of the end wall 40, such that the supporting base 42 can improve structural strength of the end wall 40.

The first mounting member 44 has a first portion 58, and the second mounting member 46 has a second portion 60. The first portion 58 and the second portion 60 are configured to respectively pass through the first hole 54a and the second hole 54b of the end wall 40. Each of the first portion 58 and the second portion 60 has a first thread feature 61. On the other hand, each of the first base hole 56a, the second base hole 56b and the third base hole 56c of the supporting base 42 has a second thread feature 62. Wherein, the first thread feature 61 of the first mounting member 44 is configured to be screwed into the second thread feature 62 of the first base hole 56a of the supporting base 42; the first thread feature 61 of the second mounting member 46 is configured to be screwed into the second thread feature 62 of the second base hole 56b of the supporting base 42. The first thread feature 61 and the second thread feature 62 can be threads having corresponding structures.

Figure 4:
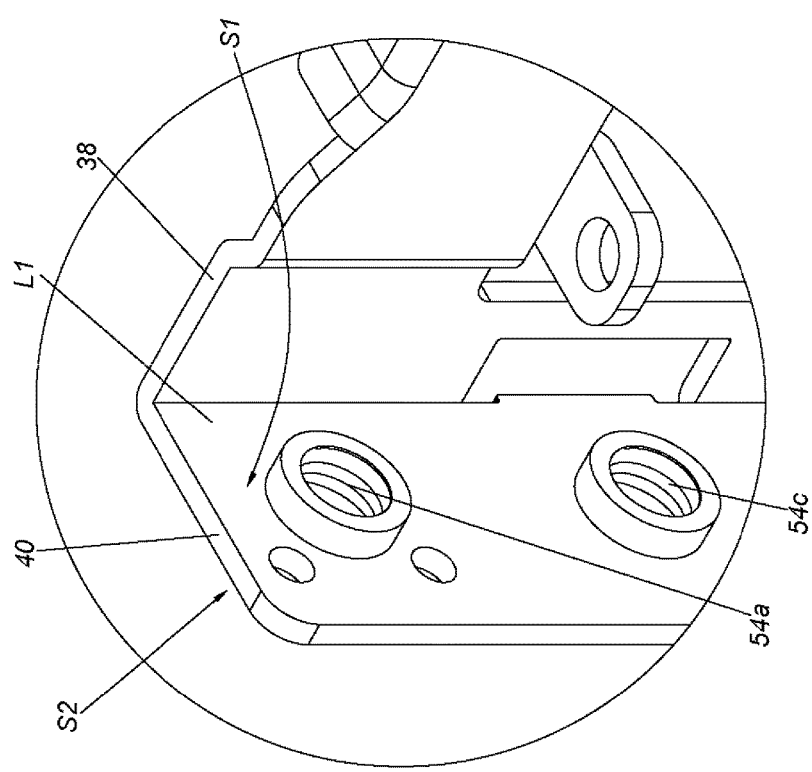
FIG. 4 is a partial enlarged view of a side wall and an end wall of FIG. 2 in another angle according to an embodiment of the present invention.

Preferably, the first bracket device 34 further comprises an elastic member 64 and a fastening member 66. The elastic member 64 is configured to provide an elastic force to the fastening member 66. In particular, the fastening member 66 is pivoted to a pair of protruded lugs 70 of the side wall 38 through a pivoting member 68. The fastening member 66 has at least one fastening part 72. On the other hand, the elastic member 64 is arranged on the side wall 38, and the elastic member 64 is located at the first side S1 of the end wall 40. The elastic member 64 comprises an elastic part 74 located between the blocking part 50 and the fastening member 66. Preferably, the fastening member 66 partially passes through the opening 48 to abut against the elastic part 74 of the elastic member 64. The fastening part 72 of the fastening member 66 is configured to be held at the second side S2 of the end wall 40 in response to the elastic force of the elastic member 64. In addition, the end wall 40 has a first surface L1, and the supporting base 42 has a second surface L2. The second surface L2 faces toward the first surface L1 (refer to FIG. 2 and FIG. 4).

Figure 5:
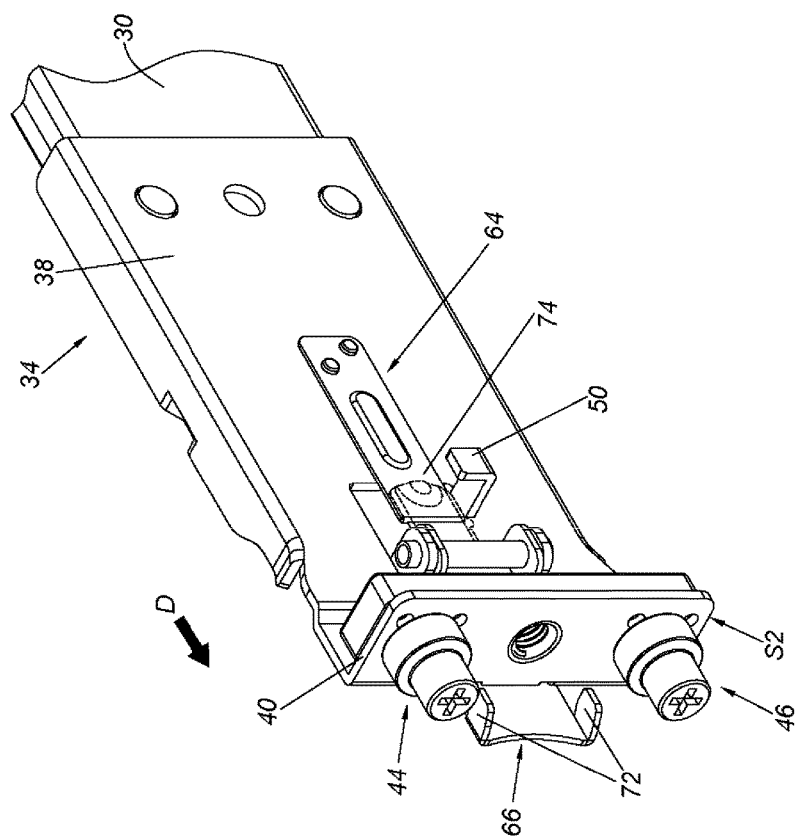
FIG. 5 is a diagram showing the slide rail being mounted toward a post of a rack through the bracket device according to an embodiment of the present invention.
Figure 5:
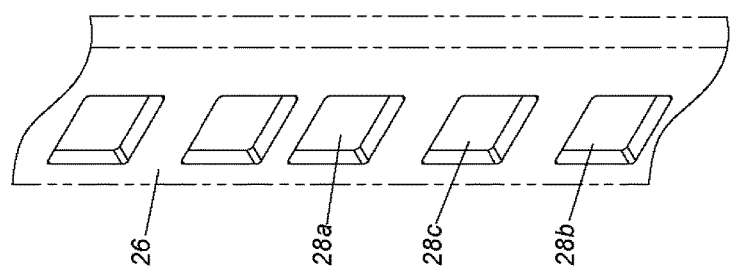
Figure 6:
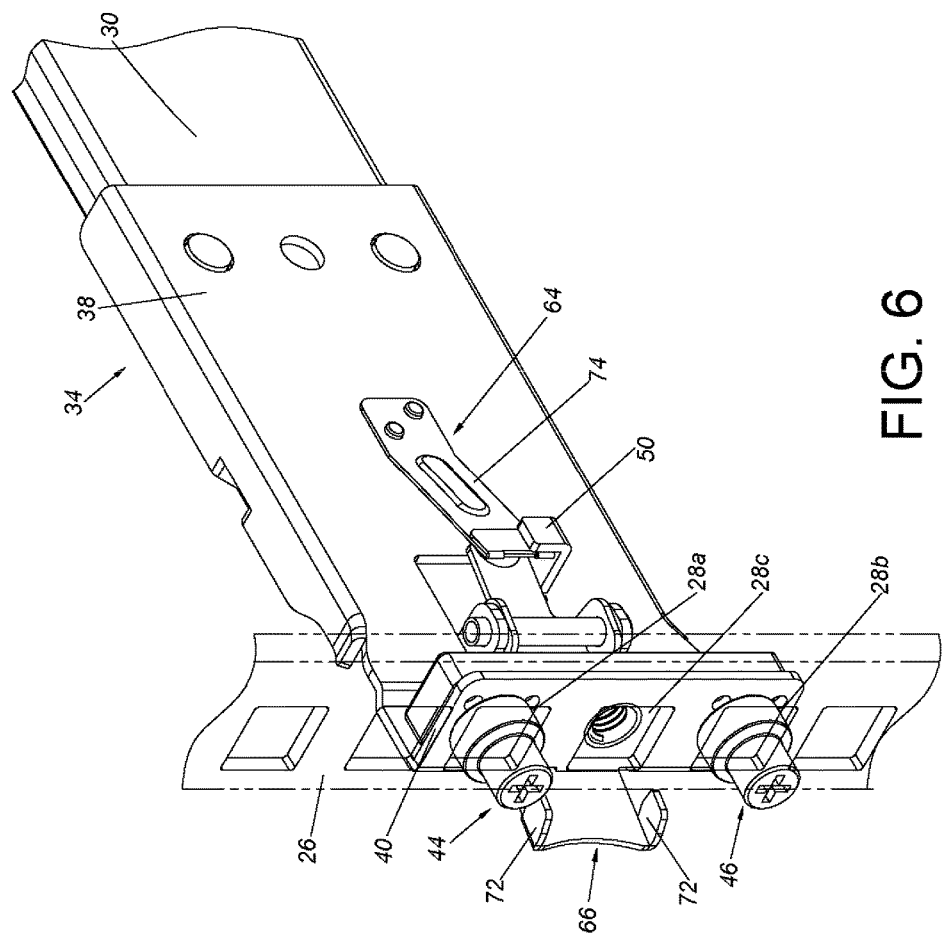
FIG. 6 is a diagram showing mounting members of the bracket device passing through post holes of the post, and a fastening member being deflected according to an embodiment of the present invention.

As shown in FIG. 5 and FIG. 6, when the first rail 30 of the slide rail assembly is going to be mounted to one of the posts 26 of the rack 24, a user can move the first rail 30 along a direction D, such that the first mounting member 44 and the second mounting member 46 of the first bracket device 34 respectively pass through the first post hole 28a and the second post hole 28b of the post 26. On the other hand, the fastening member 66 can be operated to deflect relative to the side wall 38, so as to allow the elastic part 74 of the elastic member 64 to accumulate the elastic force. After the first mounting member 44 and the second mounting member 46 are respectively inserted into the first post hole 28a and the second post hole 28b completely, the fastening part 72 of the fastening member 66 can be held at the second side S2 of the end wall 40 once again in response to the elastic force released by the elastic member 64, in order to lock the post 26 (refer to FIG. 7), such that the first bracket device 34 is mounted to the post 26. Wherein, when the elastic part 74 of the elastic member 64 accumulates the elastic force, the elastic part 74 is configured to abut against the blocking part 50 in order to prevent the elastic part 74 from being excessively deflected.

Figure 7:
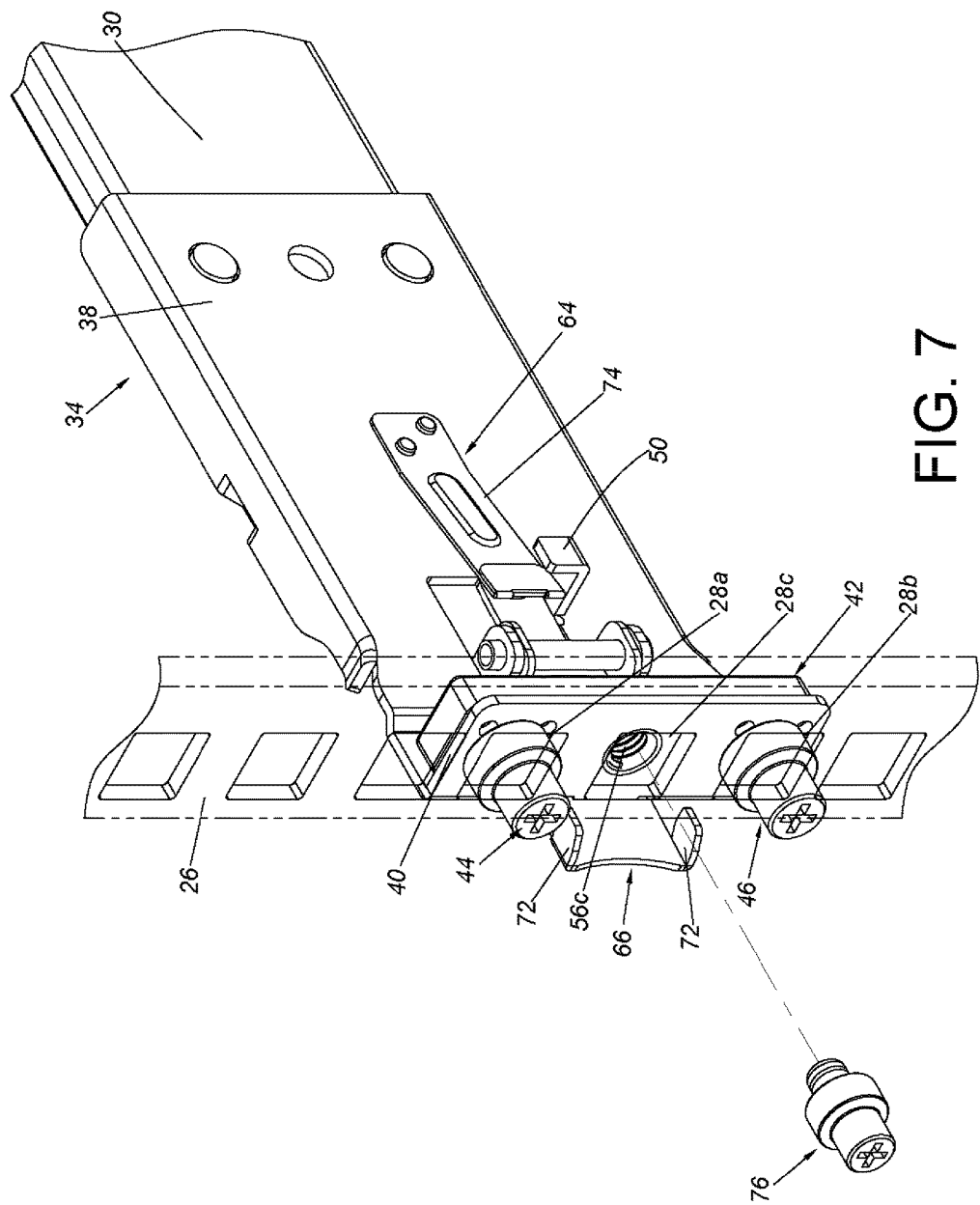
FIG. 7 is a diagram showing the slide rail being mounted to the post of the rack through the bracket device according to an embodiment of the present invention.

Moreover, as shown in FIG. 7, when the first bracket device 34 is mounted to the post 26, a third mounting member 76 can be used to pass through the third post hole 28c of the post 26 for being further screwed into the third base hole 56c of the supporting base 42 in order to improve stability. Wherein, structure arrangement of the third mounting member 76 is substantially identical to that of the first mounting member 44 or the second mounting member 46. For simplification, no further illustration is provided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bracket device configured to mount a slide rail to a rack, the rack comprising a post with a first post hole and a second post hole, the bracket device comprising:
   a side wall mounted to the slide rail and comprising a blocking part; an end wall substantially perpendicularly connected to the side wall, the end wall having a first hole and a second hole, wherein the rack has a first side facing the end wall and a second side opposite to the first side;
   a first mounting member attached to the end wall and configured to pass through the first post hole of the post of the rack from the first side to the second side of the rack, the first mounting member having a first portion passing through the first hole of the end wall, the first portion of the first mounting member having a first thread feature; and
   a supporting base having a first base hole and a second base hole, each of the first base hole and the second base hole having a second thread feature;
   wherein the first thread feature of the first mounting member is configured to be screwed into the second thread feature of the first base hole of the supporting base;
   wherein the second base hole of the supporting base is arranged at a position corresponding to the second hole of the end wall;
   wherein the supporting base is located at a first side of the end wall, the bracket device further comprises an elastic member and a fastening member, the elastic member has an end connected to the side wall and is configured to provide an elastic force to the fastening member, the fastening member is pivoted to the side wall and rotatable relative to the side wall, the fastening member has a fastening part configured to be held at a second side of the end wall in response to the elastic force of the elastic member, in order to lock the post of the rack, the second side of the end wall is opposite to the first side of the end wall, another end of the elastic member movably abuts against the blocking part, the elastic member is arranged on the side wall, and the elastic member comprises an elastic part located between the blocking part and the fastening member;
   wherein the end wall has a first thickness, and the supporting base has a second thickness greater than the first thickness; and
   wherein the side wall has an opening, the fastening member partially passes through the opening to abut against the elastic part of the elastic member.

2. The bracket device of claim 1, further comprising a second mounting member configured to pass through the second post hole of the post of the rack, wherein the second mounting member has a second portion passing through the second hole of the end wall, and the second portion of the second mounting member has the first thread feature configured to be screwed into the second thread feature of the second base hole of the supporting base.

3. The bracket device of claim 1, wherein the end wall further has a third hole, the supporting base further has a third base hole having the second thread feature, and the third base hole is arranged at a position corresponding to the third hole.

4. The bracket device of claim 1, wherein the second thickness is at least two times greater than the first thickness.

5. The bracket device of claim 1, wherein the second thickness is defined by all portions of the supporting base.

6. The bracket device of claim 5, wherein the supporting base with the second thickness greater than the first thickness is for strengthening structural strength of the end wall when the supporting base is mounted with the end wall, which enables the first mounting member to be mounted to the rack in a tool-less manner.

7. A bracket device configured to mount a slide rail to a rack, the rack comprising a post with a first post hole and a second post hole, the bracket device comprising:
   a side wall mounted to the slide rail and comprising a blocking part;
   an end wall substantially perpendicularly connected to the side wall, the end wall having a first hole and a second hole, wherein the rack has a first side facing the end wall and a second side opposite to the first side;
   a first mounting member attached to the end wall and configured to pass through the first post hole of the post of the rack from the first side to the second side of the rack, the first mounting member having a first portion passing through the first hole of the end wall, the first portion of the first mounting member having a first thread feature; and
   a supporting base having a first base hole and a second base hole, each of the first base hole and the second base hole having a second thread feature;
   wherein the first thread feature of the first mounting member is configured to be screwed into the second thread feature of the first base hole of the supporting base;
   wherein the second base hole of the supporting base is arranged at a position corresponding to the second hole of the end wall;
   wherein the supporting base is located at a first side of the end wall, the bracket device further comprises an elastic member and a fastening member, the elastic member is configured to provide an elastic force to the fastening member, the fastening member is pivoted to the side wall and rotatable relative to the side wall, the fastening member has a fastening part configured to be held at a second side of the end wall in response to the elastic force of the elastic member, in order to lock the post of the rack, the second side of the end wall is opposite to the first side of the end wall, the elastic member is arranged on the side wall, the elastic member comprises an elastic part located between the blocking part and the fastening member;

wherein the end wall has a first thickness, and the supporting base has a front surface and a rear surface that are parallel with respect to each other, wherein each of the front and rear surfaces surrounds the first base hole and the second base hole, and wherein a second thickness taken between the front and rear surfaces is at least two times greater than the first thickness; and wherein the side wall has an opening, the fastening member partially passes through the opening to abut against the elastic part of the elastic member.

8. The bracket device of claim 7, further comprising a second mounting member configured to pass through the second post hole of the post of the rack, wherein the second mounting member has a second portion passing through the second hole of the end wall, and the second portion of the second mounting member has the first thread feature configured to be screwed into the second thread feature of the second base hole of the supporting base, the end wall further has a third hole, the supporting base further has a third base hole having the second thread feature, and the third base hole is arranged at a position corresponding to the third hole, the elastic member has an end connected to the side wall, another end of the elastic member movably abuts against the blocking part.

9. A bracket device configured to mount a slide rail to a rack, the rack comprising a post with a first post hole and a second post hole, the bracket device comprising:
 a side wall mounted to the slide rail and comprising a blocking part;
 an end wall substantially perpendicularly connected to the side wall, the end wall having a first hole and a second hole, wherein the rack has a first side facing the end wall and a second side opposite to the first side;
 a first mounting member attached to the end wall and configured to pass through the first post hole of the post of the rack from the first side to the second side of the rack, the first mounting member having a first portion passing through the first hole of the end wall, the first portion of the first mounting member having a first thread feature; and
 a supporting base having a first base hole and a second base hole, each of the first base hole and the second base hole having a second thread feature;
 wherein the first thread feature of the first mounting member is configured to be screwed into the second thread feature of the first base hole of the supporting base;
 wherein the second base hole of the supporting base is arranged at a position corresponding to the second hole of the end wall;
 wherein the supporting base is located at a first side of the end wall, the bracket device further comprises an elastic member and a fastening member, the elastic member is configured to provide an elastic force to the fastening member, the fastening member is pivoted to the side wall and rotatable relative to the side wall, the fastening member has a fastening part configured to be held at a second side of the end wall in response to the elastic force of the elastic member, in order to lock the post of the rack, the second side of the end wall is opposite to the first side of the end wall, the elastic member is arranged on the side wall, and the elastic member comprises an elastic part located between the blocking part and the fastening member;
 wherein the end wall has a first thickness, and the supporting base has a second thickness that is at least two times greater than the first thickness for strengthening structural strength of the end wall when the supporting base is mounted with the end wall, which enables the first mounting member to be mounted to the rack in a tool-less manner; and
 wherein the side wall has an opening, the fastening member partially passes through the opening to abut against the elastic part of the elastic member.

10. The bracket device of claim 9, further comprising a second mounting member configured to pass through the second post hole of the post of the rack, wherein the second mounting member has a second portion passing through the second hole of the end wall, and the second portion of the second mounting member has the first thread feature configured to be screwed into the second thread feature of the second base hole of the supporting base, the end wall further has a third hole, the supporting base further has a third base hole having the second thread feature, and the third base hole is arranged at a position corresponding to the third hole, the elastic member has an end connected to the side wall, another end of the elastic member movably abuts against the blocking part.

* * * * *